United States Patent [19]
Whitbey

[11] Patent Number: 5,209,162
[45] Date of Patent: May 11, 1993

[54] ADDITIONAL COLOR DENSITY METHOD

[76] Inventor: Jeffrey R. Whitbey, P.O. Box 311, Rochester, Mich. 48308

[21] Appl. No.: 772,099

[22] Filed: Oct. 7, 1991

[51] Int. Cl.$^5$ .......................... B41M 1/18; B41M 1/14
[52] U.S. Cl. .................................................... 101/211
[58] Field of Search ......................................... 101/211

[56] References Cited

U.S. PATENT DOCUMENTS 3,554,123  1/1971  Lewallen .................... 101/211 X Primary Examiner—Clifford D. Crowder

[57] ABSTRACT

Additional Color Density Method is a process utilizing, but not limited to, an additional plate of each of the 4 standard process colors; magenta, cyan, yellow, and black, whereas the first plate of each color is the same as conventional 4-color plates and, whereas the second plate of each color is an Additional Color Density Method utilized to produce the difference between a conventional original density-to-reproduction density gradation curve and a more desirable enhanced original density-to-redirection density curve, whereas the 8 colors of the combination 4-color process with Additional Color Density Method reproduces an image that offers the additional contrast of high density maximum with a gentle control throughout the gradation curve that is smooth and void of harsh contrast changes.

1 Claim, 1 Drawing Sheet

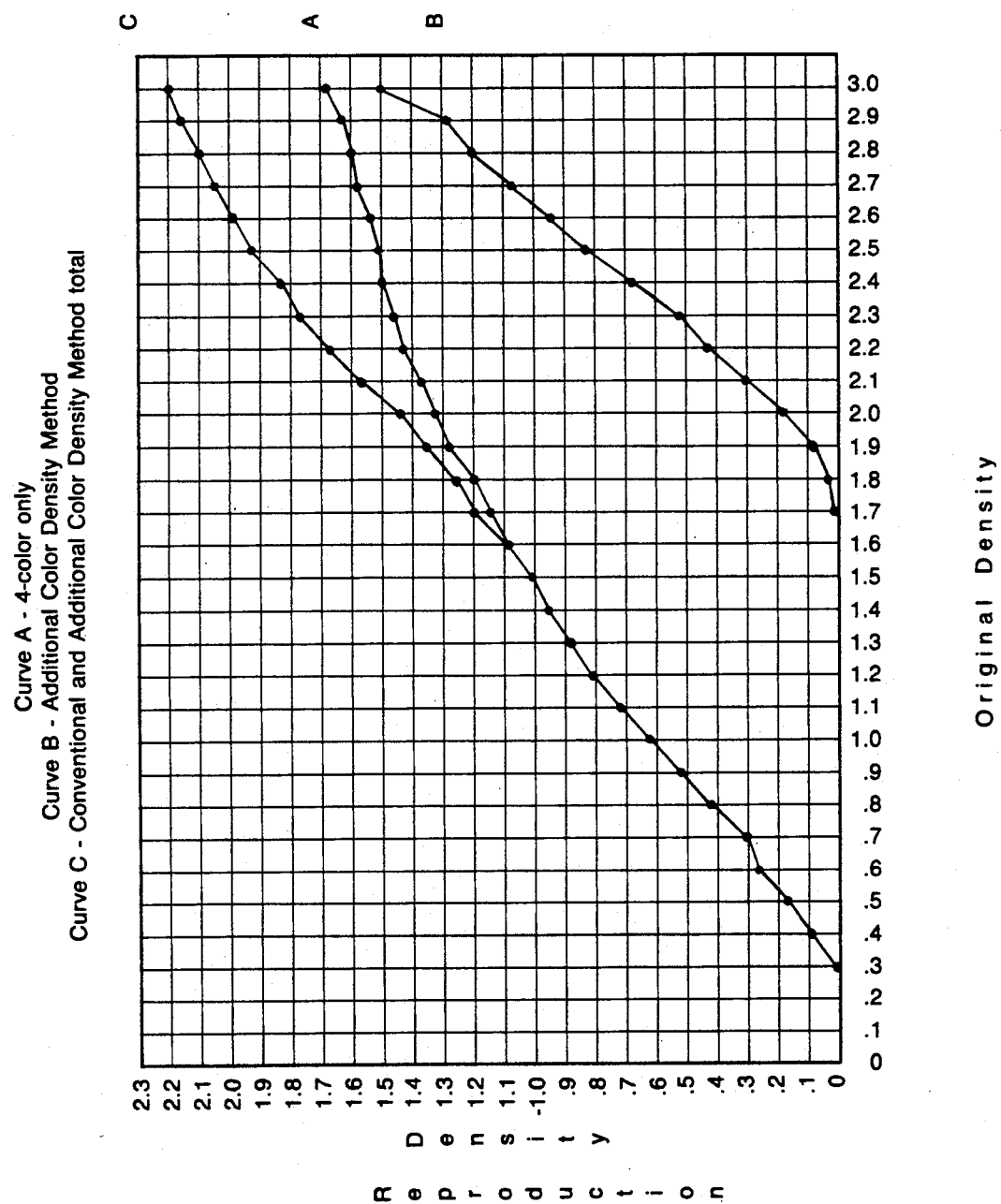

ADDITIONAL COLOR DENSITY METHOD

BACKGROUND—FIELD OF INVENTION

This invention primarily relates to color printing: specifically, a process to increase saturated colors and maximum density with a controlled process.

BACKGROUND—DESCRIPTION OF PRIOR ART

Additional Color Density Method is a graphic arts process that is utilized for the reproduction of color images comprising, but not limited to, offset lithography.

The prior art of 4-color reproduction is limited in density range and is unable to reproduce the depth and saturation of Additional Color Density Method.

A practice of using touch plates yields saturated colors but fails to moderate a harsh mid tone. Also, the use of one touch plate adversely affects grey balance. Additional Color Density Method facilitates the additional density and saturation color while moderating the mid tones.

SUMMARY OF THE PROCESS AND ADVANTAGES

Conventional 4-color process traditionally has a tone compression from original density to reproduction density that falls off with more compression in the shadow range.

The object of Additional Color Density Method is to enhance the compressed shadow range and to accomplish this enhancement in a controlled fashion that provides the additional density at each point on the tone curve, whereas, to create a gently enhanced tone curve.

Rapid introduction of the additional 4-color plates or reaching a high density peak too soon are problems that hinder the appearance of the image by making it look "cartoonish" and unnatural. Additional Color Density Method provides necessary methods to control and govern the additional density.

An image is reproduced with Additional Color Density Method by creating a conventional set of color plates and an additional set of color plates comprising the necessary densities to create a gently enhanced tone curve that may be printed with offset lithography or other reproduction processes.

Additional Color Density Method is comprised, but not limited to, the use of (2) two yellow, (2) two magentas, (2) two cyans, and (2) two blacks. Other color systems or pigments could also be used.

Additional Color Density Method is created by reproducing 2 tone curves together so that the resulting tone curve is enhanced and smooth. Steps to create this process comprise a) plotting and becoming aware of a reproduction to original density tone curve of the conventional process b) by trial, establish a reasonable maximum density obtainable with an additional color c) plot a smooth curve from the existing highlight to the new shadow d) obtain the necessary additional color density needed so that when added to the existing image, the sum of the two images produces the new density.

When using electronic laser scanning for reproduction, the new tone curve may be produced by entering the additional image densities into a gradation curve on the scanning software that corresponds to the existing art curve.

When using photographic means for reproduction, the new tone curve would require a flash exposure or other manipulation to create an additional tone curve.

Additional Color Density Method is a process that will reproduce an enhanced image that is natural and pleasant to view.

DRAWING DESCRIPTION

A graph showing (3) three tone curves has been produced as a visual demonstration of the Additional Color Density Method.

The information charted on this graph has been obtained by printing with offset lithography: a grey scale with conventional 4-color process, the grey scale with the Additional Color Density Method plates only, and a full combination of conventional 4-color process/Additional Color Density Method. Reproduction densities were obtained from the grey scales and plotted against original densities.

Curve A represents conventional 4-color process as the existing art is, and also used as one set of plates on Additional Color Density Method.

Curve B represents the Additional Color Density Method plates used to make the summed densities of the Additional Color Density Method to the combination of conventional 4-color process/Additional Color Density Method curve.

Curve C represents the sum total of the conventional first set of plates and the additional second set Additional Color Density Method.

The highlight to mid tone curve is the same as conventional 4-color printing and, as the conventional curve falls off and compresses, the second set of plates creates the density difference to maintain an enhanced tone curve that is possible with Additional Color Density Method.

I claim:

1. A process of producing an enhanced multicolor image comprising:
   (a) making a first set of color plates;
   (b) plotting reproduction density against original density to create a first tone curve representative of an image produced by said first set of color plates;
   (c) establishing a reasonable maximum density obtainable for the preproduction density when the time is printed with a second set of color plates in addition to said first set of color plates;
   (d) adding the established density of step (c) to the reproduction density of the fist tone curve and plotting it against original density to create a second, smooth tone curve;
   (e) ascertaining the density needed in addition to that of the first tone curve to form an image representative of the second tone curve;
   (f) making a second set of color plates comprising the necessary density determined in step (e);
   (g) printing an image using both the first and second sets of color plates to produce an enhanced multicolor image.

* * * * *